United States Patent
Yu et al.

(10) Patent No.: US 8,438,036 B2
(45) Date of Patent: May 7, 2013

(54) ASYNCHRONOUS SAMPLING RATE CONVERTER FOR AUDIO APPLICATIONS

(75) Inventors: Shawn X. Yu, Austin, TX (US); Terry L. Sculley, Lewisville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 870 days.

(21) Appl. No.: 12/553,713

(22) Filed: Sep. 3, 2009

(65) Prior Publication Data

US 2011/0054913 A1    Mar. 3, 2011

(51) Int. Cl.
*G10L 19/00* (2006.01)

(52) U.S. Cl.
USPC ............................ 704/500; 704/503; 704/200

(58) Field of Classification Search .................. 704/500, 704/502, 503, 200
See application file for complete search history.

(56) References Cited

U.S. PATENT DOCUMENTS

| | | | |
|---|---|---|---|
| 7,262,716 B2 | 8/2007 | Yu et al. | |
| 7,330,812 B2 | 2/2008 | Ding | |
| 7,408,485 B1 | 8/2008 | Yu et al. | |
| 7,487,193 B2 | 2/2009 | Srinivasan et al. | |
| 7,826,578 B1* | 11/2010 | Melanson et al. | 375/354 |
| 7,929,718 B1* | 4/2011 | Gephardt et al. | 381/120 |
| 7,970,088 B2* | 6/2011 | Chieng et al. | 375/355 |
| 2003/0179116 A1* | 9/2003 | Oki | 341/61 |
| 2004/0068399 A1 | 4/2004 | Ding | |
| 2005/0018862 A1 | 1/2005 | Fisher | |
| 2007/0192390 A1* | 8/2007 | Wang et al. | 708/270 |
| 2007/0293174 A1* | 12/2007 | Hayden | 455/214 |

FOREIGN PATENT DOCUMENTS

EP    0673018    9/1995

* cited by examiner

*Primary Examiner* — Qi Han
(74) *Attorney, Agent, or Firm* — Alan A. R. Cooper; Wade J. Brady, III; Frederick J. Telecky, Jr.

(57) ABSTRACT

In recent years, it has become commonplace for portable devices to generate analog audio signals from numerous sources, meaning that the codecs employed in these portable devices need to be able to utilize various digital bit streams at different sampling rates. To date, however, the circuitry for asynchronous sampling rate conversions for multiple bit streams has been complex, rigid, and power hungry. Here, a codec is provided which uses miniDSP cores to perform asynchronous sampling rate conversion efficiently and with reduced power consumption compared to other conventional codecs.

17 Claims, 4 Drawing Sheets

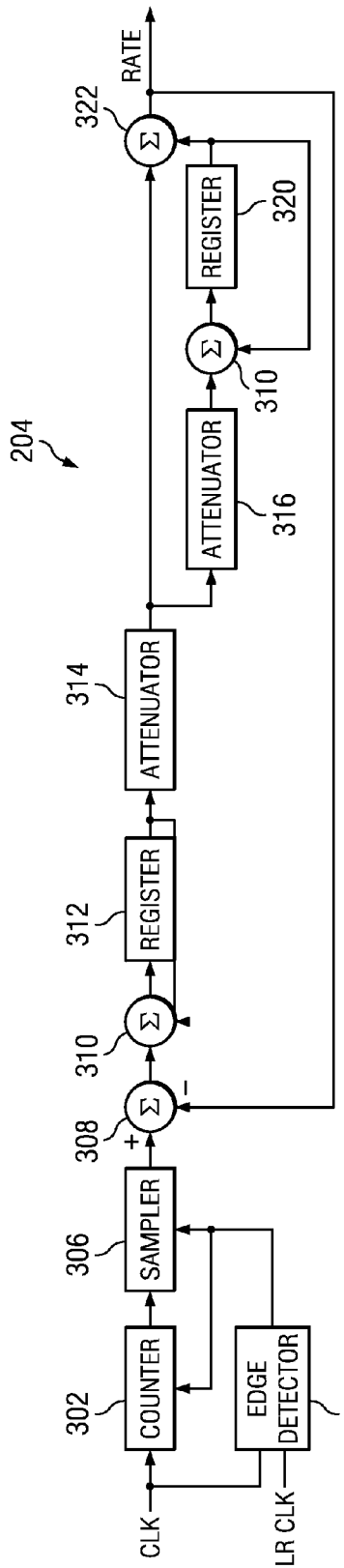
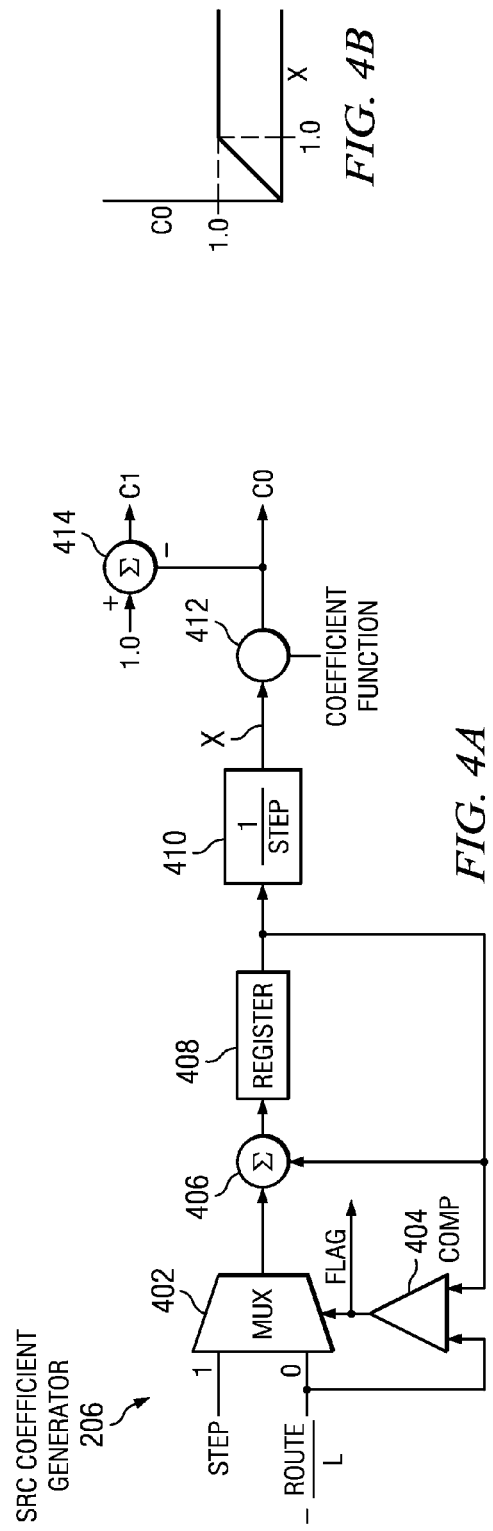
FIG. 3
FIG. 4A
FIG. 4B

US 8,438,036 B2

ASYNCHRONOUS SAMPLING RATE CONVERTER FOR AUDIO APPLICATIONS

TECHNICAL FIELD

The invention relates generally to an audio codec and, more particularly, to an audio codec having an asynchronous sampling rate converter.

BACKGROUND

Many portable audio devices have numerous functions. Each of these functions may have one or more digital audio bit streams associated with it, which may each have different sampling frequencies and which require conversion to an analog format for playback. Problems, however, arise with mixing and power consumption because most codecs used for such applications consume a great deal of power to provide asynchronous audio playback.

Some examples of conventional circuits are: European Patent No. 0673018A2; U.S. Pat. No. 7,330,812; U.S. Pat. No. 7,487,193; U.S. Patent Pre-Grant Publ. No. 2004/0068399; and U.S. Patent Pre-Grant Publ. No. 2005/0018862.

SUMMARY

A preferred embodiment of the present invention, accordingly, provides an apparatus. The apparatus comprises an input port that outputs a plurality of signals, wherein each signal is sampled at one of a plurality of frequencies; a rate estimator that is coupled to the input port, wherein the rate estimator determines at least one of the frequencies; a sampling rate converter (SRC) coefficient generator that is coupled to the rate estimator, wherein the SRC coefficient generator calculates a plurality of filter coefficients; a digital signal processor (DSP) that is coupled to the SRC coefficient generator and the input port, wherein the DSP performs digital-to-analog conversion filtering for the signal received from the input port and the filter coefficients from the SRC coefficient generator; and interface circuitry that is coupled to DSP and the input port, wherein the interface circuitry receives an output signal from the DSP.

In accordance with a preferred embodiment of the present invention, the DSP further comprises: a plurality of interpolation filter circuits, wherein each interpolation filter circuit receives at least one of the signals from the input port; and a finite impulse response (FIR) filter that receives an output signal from at least one of the interpolation filter circuits and that receives the filter coefficients, wherein the FIR filter has two taps.

In accordance with a preferred embodiment of the present invention, the DSP further comprises: a zero order hold (ZOH) circuit that is coupled to at least one of the interpolation filters; and a mixer that is coupled to the ZOH circuit and the FIR filter.

In accordance with a preferred embodiment of the present invention, the SRC coefficient generator further comprises: a multiplexer having an output terminal, a plurality of input terminals, and a selection terminal, wherein each of the input terminals of the multiplexer receives one of a step signal and an interpolation ratio; a first adder that is coupled to the output terminal of the multiplexer; a register that is coupled to the adder; a comparator that is coupled to the register and the selection terminal of the multiplexer and that receives the interpolation ratio; a divider that is coupled to the register; a coefficient function circuit that is coupled to the divider; and a second adder that is coupled to the coefficient function generating circuit.

In accordance with a preferred embodiment of the present invention, the rate estimator further comprises: a counter that receives a clock signal, wherein the clock signal is proportional to at least one of the frequencies; a sampler that is coupled to the counter; an edge detector that is coupled to each of the counter and the sampler; a first adder that is coupled to the sampler; a second adder that is coupled to the first adder; a first register that is coupled to the second adder and the first adder; a first attenuator that is coupled to the first register; a second attenuator that is coupled to the first attenuator; a third adder that is coupled to the second attenuator; a second register that is coupled to the third adder; and a fourth adder that is coupled to the second register and the first attenuator.

In accordance with a preferred embodiment of the present invention, an apparatus is provided. The apparatus comprises a plurality of audio sources; a codec having: an input port that outputs a plurality of signals, wherein each signal is sampled at one of a plurality of frequencies; a rate estimator that is coupled to the input port, wherein the rate estimator determines at least one of the frequencies; a SRC coefficient generator that is coupled to the rate estimator, wherein the SRC coefficient generator calculates a plurality of filter coefficients; a DSP that is coupled to the SRC coefficient generator and the input port, wherein the DSP performs digital-to-analog conversion filtering for the signal received from the input port and the filter coefficients from the SRC coefficient generator; interface circuitry that is coupled to DSP and the input port, wherein the interface circuitry receives an output signal from the DSP; and a output port that is coupled to the interface circuitry; an amplifier that is coupled to the output port; and a speaker that is coupled to the amplifier.

In accordance with a preferred embodiment of the present invention, the interface circuitry further comprises: a ZOH circuit that is coupled to the DSP; a digital modulator that is coupled to the ZOH circuit; and a digital-to-analog converter (DAC) that is coupled to the digital modulator and to the output port.

In accordance with a preferred embodiment of the present invention, the interface circuitry further comprises: a first ZOH circuit that is coupled to the DSP; a second ZOH circuit that is coupled to the DSP; a mixer that is coupled to the first and second ZOH circuits; a digital modulator that is coupled to the mixer; and a DAC that is coupled to the digital modulator and to the output port.

In accordance with a preferred embodiment of the present invention, an apparatus is provided. The apparatus comprises an input port that outputs a plurality of signals, wherein each signal is sampled at one of a plurality of frequencies; a rate estimator that is coupled to the input port, wherein the rate estimator determines at least one of the frequencies; an SRC coefficient generator that is coupled to the rate estimator, wherein the SRC coefficient generator calculates a plurality of filter coefficients; a DSP that is coupled to the SRC coefficient generator and the input port, wherein the DSP has a computer program product embodied thereon that includes: computer code for upsampling each of the signals from the input port; computer code for decoding a coefficient address; computer code for retrieving a coefficient from a memory; computer code for multiplexing the plurality of filter coefficients and the coefficient from the memory; and computer code for outputting a digital signal; and interface circuitry that is coupled to DSP, wherein the interface circuitry receives the digital signal and provides an analog signal.

In accordance with a preferred embodiment of the present invention, the computer program product further comprises: computer code for applying a ZOH to at least one of the upsampled signals; and computer code for mixing the digital signal with the upsampled signal with the applied ZOH.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is an example of a rate estimator of FIGS. 2A and 2B;

FIGS. 4A and 4B are an example of a sampling rate converter (SRC) coefficient generator of FIGS. 2A and 2B.

DETAILED DESCRIPTION

Figure 1:
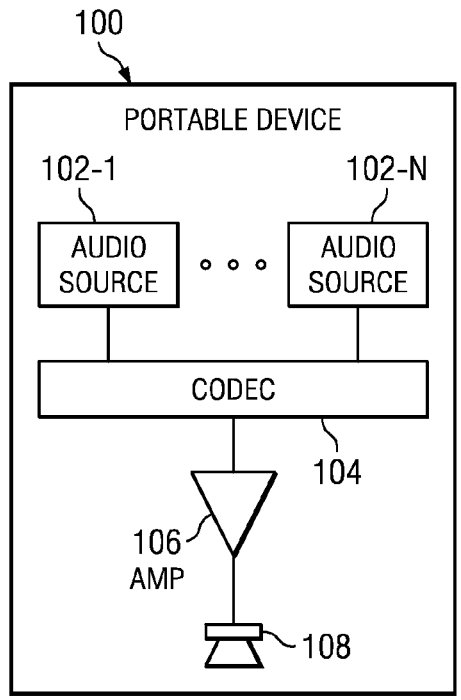
FIG. 1 is an example of a portable device in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a portable device in accordance with a preferred embodiment of the present invention. The portable device 100 generally comprises audio sources 102-1 to 102-N, codec 104, amplifier 106, and speaker 108. Each of the audio sources 102-1 to 102-N each provides a digital audio bit stream or signal at a sampling frequency, which may differ from the other signals. The codec 104 is able to receive each of these signals and convert them to an analog audio signal, which can be amplified by amplifier 106 and played back through the speaker 108.

Figure 2A:
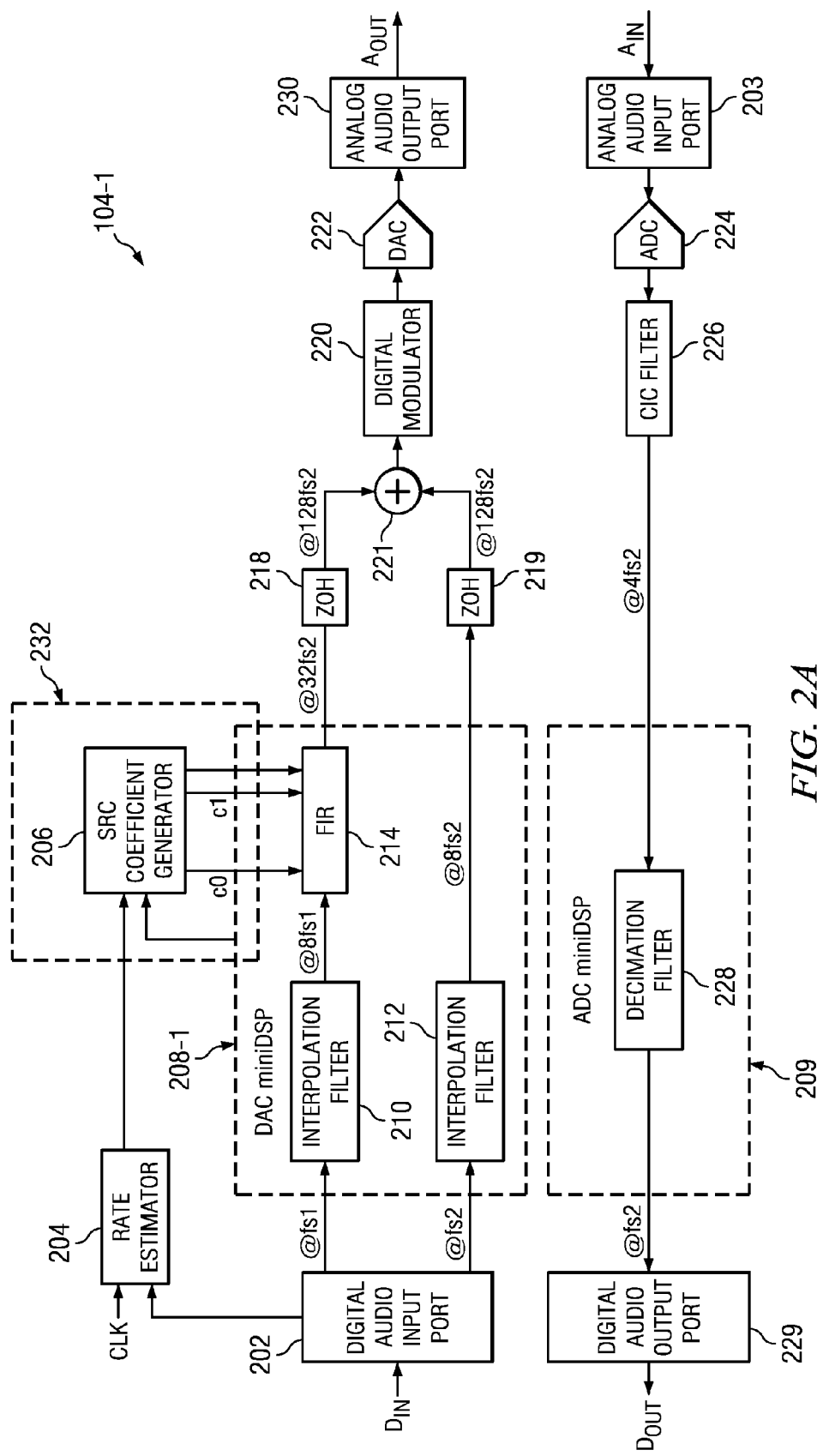
FIGS. 2A and 2B are examples of a codec of FIG. 1.

Turning to FIG. 2A, an example (104-1) of codec 104 (of FIG. 1) can be seen. Codec 104-1 generally comprises a digital audio input port 202, an analog audio input port 203, a mini-Digital Signal Processor (DSP) for digital-to-analog conversion (DAC miniDSP) 208-1, rate estimator 204, sampling rate converter (SRC) coefficient generator 206, an interface circuit, and a miniDSP for analog-to-digital conversion (ADC miniDSP) 209. The interface circuitry generally comprises zero order hold (ZOH) circuits 218 and 219, mixer 221, digital modulator 220, analog digital-to-analog converter (DAC) 222, an analog audio output port 230, digital audio output port 229, analog analog-to-digital converter (ADC) 224, and cascaded integrator-comb (CIC) filter 226. Additionally, it should be noted that two separate DSP cores (one for each of miniDSPs 208 and 209), but a single DSP core may be used.

Figure 2B:
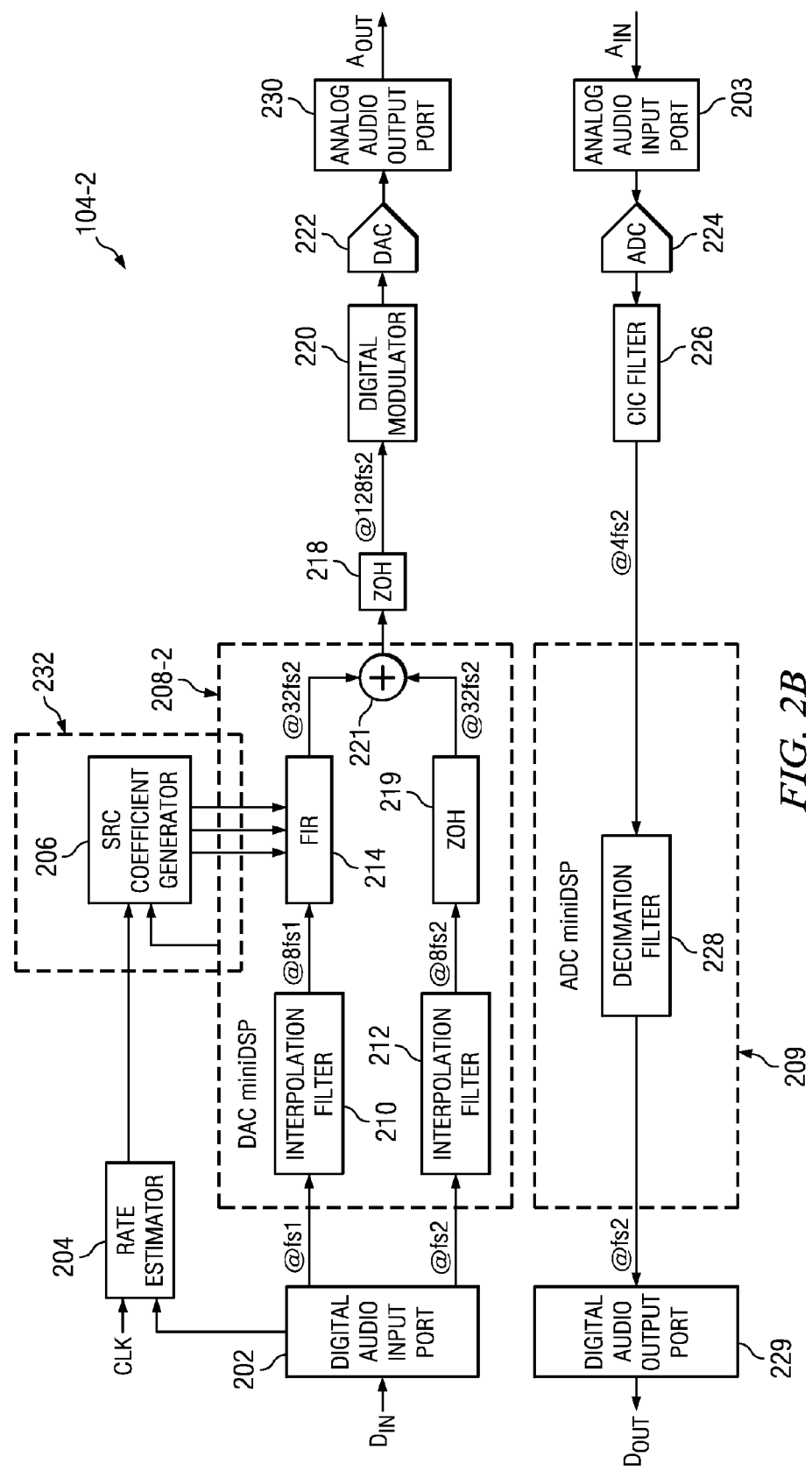

In operation, for outputting audio signals, the audio input port 202 (which may include a multiplexer or other circuitry) provides multiple audio bit streams or signals to DAC miniDSP 208-1. As shown, for example, two signals are provided, which one signals being at sampling frequency fs1 and one signal being at sampling frequency fs2. In this configuration, DAC miniDSP 208-1 is designed to operate at frequency fs2. Within DAC miniDSP 208-1, a computer program product is provided to operate as interpolation filters 210 and 212 for each of the two signals provided by port 202. In this example, each interpolation filter 210 and 212 upsamples its input signal to signals at frequencies $8fs1$ and $8fs2$, respectively. Additionally, computer program product of DAC miniDSP 208-1 includes a two-tap finite impulse response (FIR) filter 214 that receives the signal from interpolation filter 210 and filter coefficients from SRC coefficient generator which allow the signal to be converted to a signal at frequency $32f2$. Each of the signals (which are at multiples of frequency fs2) are output from DAC miniDSP 208-1 to zero order hold (ZOH) circuits 218 and 219 and upsamples to frequency $128fs2$. These signals are mixed by mixer 221, and converted to an output audio signal AOUT through digital modulator 220 (preferably a sigma-delta modulator), DAC 222, and audio output port 230. Alternatively, as can be seen in FIG. 2B, the circuitry can be rearranged so that the ZOH circuit 218 and mixer 221 are replaced by computer code in DAC miniDSP 208-2 and that a signal to be output to ZOH 218.

Additionally, each of codecs 104-1 and 104-2 include circuitry to receive analog signals. Under some circumstances, portable device 100 may include a microphone or other analog sources. To use the analog signal AIN, it can be received by port 203 and provided to ADC 224. CIC filter 226 converts the output of ADC 224 to a signal at frequency $4fs2$, which is provided to ADC miniDSP 209. ADC miniDSP 209 includes a computer program product that operates as a decimation filter 228 to downsample the signal to frequency fs2, which is then output through output port 229 as digital signal DOUT.

Turning to FIG. 3, the rate estimator 204 can be seen in greater detail. Rate estimator 204 generally estimates the frequency or rate (such as fs1) based on a clock signal CLK (which is generated within the codec 104-1 or 104-2 for the analog DAC 222 operation with frequency at 128*fs2) by operating as a second order filter. In this case, for example, the clock signal is proportional to frequency fs2, while edge detector 304 receives left/right clock signal LRCLK from port 202, which indicates data for the left or right channel based on its polarity. This clock signal CLK is received by counter 302, where the content of counter 302 increments by 1 at every active edge of clock signal CLK. Sampler 306 is coupled to the counter 302 and it copies the content of counter 304 controlled by the signal from the edge detector 304. Whenever the edge detector finds a rising edge of left/right clock signal LRCLK at active edges of CLK, it sends a signal to sampler 306 to copy the content of counter 302 and at the same time resets counter 302 with the same signal. This sampled output is then filtered through two integrators (adders 308, 310, 318, and 322, registers 312 and 320, and attenuators 314 and 316), which operate as the second order filter, to generate the rate signal RATE (of frequency fs1, for example). Basically, the rate estimator 204 is using CLK with frequency of 128*fs2 to estimate the rate of the clock signal LRCLK (which is at frequency fs1 or the sampling frequency of the audio data) to establish the relationship between frequencies fs1 and fs2. This information can then used to convert the audio data from frequency fs1 to frequency fs2.

Turning to FIGS. 4A and 4B, the SRC coefficient generator 206 can be seen in greater detail. The SRC coefficient generator 206 provides filter coefficients for a digital filter within miniDSP DAC 208-1 or 208-2. Generator 206 generally comprises multiplexer 402, comparator 404, adders 406 and 414, register 408, divider 410, and coefficient function circuit 412. Multiplexer 402 receives a step signal STEP with preferred value of 4 and an interpolation ratio (-RATE/L) at its input terminals, where L (for example, 8) is the upsampling factor of interpolation filters 212. Comparator 404 is coupled to the select terminal of multiplexer 402, comparing the interpolation ratio (-RATE/L) to the output of register 408. Adder 406 is coupled to the output terminal of multiplexer 402, and register 408 is coupled to adder 406. Basically, in operation, comparator 404 adds the contents of register 408 with the interpolation ratio (-RATE/L). If the result is negative, the multiplexer 402 selects step signal STEP so that the step signal STEP is added to the contents of register 408 by adder 406; otherwise, the interpolation ratio (-RATE/L) is selected. The output of comparator 404 is sent to DAC miniDSP 208-1 and 208-2 as signal FLAG. When the value of signal FLAG is 0, that is, when multiplexer 402 selects (-RATE/L), the updated samples from interpolation filter 210 should be used for two tap FIR calculation with the SRC coefficients. When the value of signal FLAG is 1, that is, when multiplexer 402 selects STEP, the same samples from interpolation filter 210 for the calculation of last SRC output samples should be used with the coefficients to calculate the current SRC output samples for left and right channels. Divider 410 is also coupled to the register 408 so to receive the contents of register 408 (which divides its input signal by the step signal STEP). This divided signal is applied to the coefficient function circuit 412, which outputs coefficient C0. As shown in FIG. 4B, coefficient C0 is between 0 and 1 and is applied to adder 414, where it is subtracted from 1.0 to generate coefficient C1.

Figure 5:
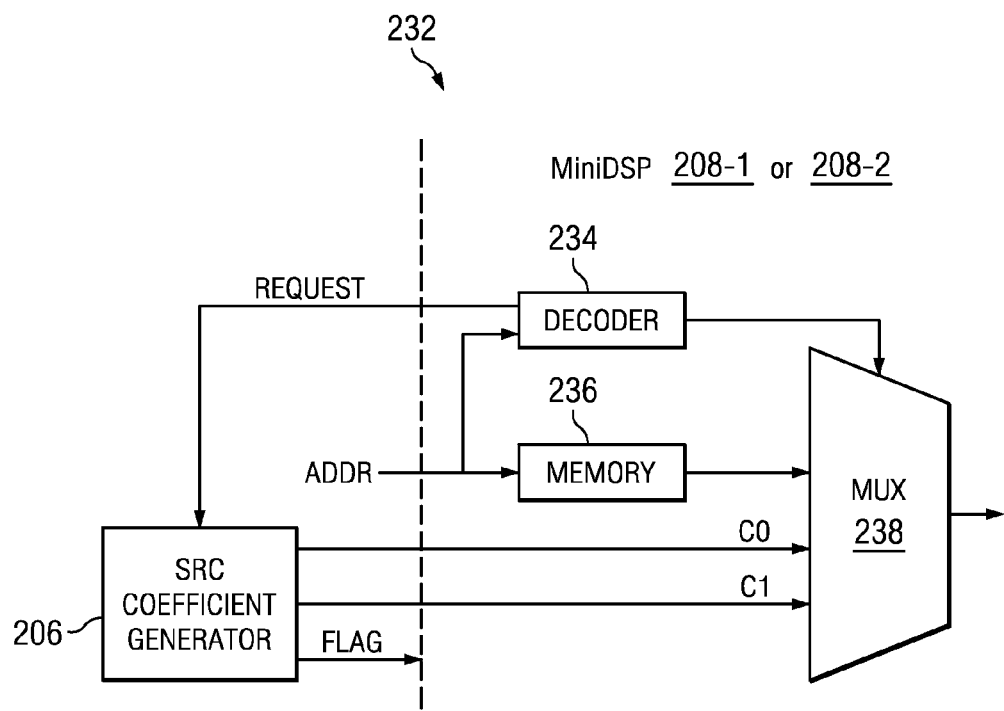
FIG. 5 is an example of a portion of the interface between the SRC coefficient generator and the mini-Digital Signal Processor for digital-to-analog conversion filtering (DAC miniDSP) of FIGS. 2A and 2B.

Typically, the filter coefficients are applied to DAC miniDSP 208-1 or 208-2 as seen in FIG. 5. Preferably, a request is made by coefficient memory address decoder 234 to generate the filter coefficients C1 and C0, when the coefficient address is received by the decoder 234 and coefficient memory 236 (which stores the coefficients for filtering including those for interpolation filters 210 and 212). The filter coefficients C1 and C0 and the coefficients from memory 236 are then multiplexed by multiplexer 238 (which is controlled by decoder 234. These coefficients C0, C1 and two tap FIR filter combined with signal FLAG allow the signal from the interpolation filter 210 that is at a frequency which is a multiple of frequency fs1 (preferably 8$fs$1) to be converted to a multiple of frequency fs2 (preferably 32$fs$2). While the last coefficient, for example, C1 for the right channel, is being latched to finish the calculation of one pair of SRC output samples, a request signal generated by the address decoder 234 is sent to the SRC coefficient generator 206 to ask for a new set of coefficients. 4 addresses are assigned for multiplexer 238 to select C0 and C1 for left and right channels, two for C0 and two for C1 even though only two coefficients are actually generated. Of all four addresses, only the address to select C1 for right channel is used to generate the signal REQUEST by the address decoder 234. Additionally, the signal FLAG (which is described with respect to FIGS. 4A and 4B above) can be provided to DAC miniDSP 208-1 or 208-2.

As a result of the configuration of codec 104-1 or 104-2, several advantages can be realized over conventional codecs. The inclusion of the miniDSPs 208-1, 208-2, and/or 209 allow for an easily reprogrammable system. The codec 104 can also be implemented as a low cost system with reduced power consumption over other, conventional codecs.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    an input port that receives a digital audio input signal and that outputs a plurality of signals obtained from the digital audio input signal, wherein each signal is sampled at one of a plurality of frequencies;
    a rate estimator that is coupled to the input port, wherein the rate estimator determines at least one of the frequencies;
    a sampling rate converter (SRC) coefficient generator that is coupled to the rate estimator, wherein the SRC coefficient generator calculates a plurality of filter coefficients;
    a digital signal processor (DSP) that is coupled to the SRC coefficient generator and the input port, wherein the DSP performs digital-to-analog conversion filtering for the signal received from the input port and the filter coefficients from the SRC coefficient generator and wherein the DSP includes:
        a plurality of interpolation filter circuits, wherein each interpolation filter circuit receives at least one of the signals from the input port;
        a finite impulse response (FIR) filter that receives an output signal from at least one of the interpolation filter circuits and that receives the filter coefficients, wherein the FIR filter has two taps;
        a zero order hold (ZOH) circuit that is coupled to at least one of the interpolation filters; and
        a mixer that is coupled to the ZOH circuit and the FIR filter; and
    interface circuitry that is coupled to the DSP and the input port, wherein the interface circuitry receives an output signal from the DSP.

2. An apparatus comprising:
    a plurality of audio sources;
    a codec that is coupled to the plurality of audio sources, wherein the codec includes:
        an input port that receives an audio input signal from the plurality of audio sources and that outputs a plurality of signals obtained from the plurality of audio sources, wherein each signal is sampled at one of a plurality of frequencies;
        a rate estimator that is coupled to the input port, wherein the rate estimator determines at least one of the frequencies;
        a SRC coefficient generator that is coupled to the rate estimator, wherein the SRC coefficient generator calculates a plurality of filter coefficients;
        a DSP that is coupled to the SRC coefficient generator and the input port, wherein the DSP performs digital-to-analog conversion filtering for the signal received from the input port and the filter coefficients from the SRC coefficient generator, and wherein the DSP includes:

a plurality of interpolation filter circuits, wherein each interpolation filter circuit receives at least one of the signals from the input port;
a FIR filter that receives an output signal from at least one of the interpolation filter circuits and that receives the filter coefficients, wherein the FIR filter has two taps;
a ZOH circuit that is coupled to at least one of the interpolation filters; and
a mixer that is coupled to the ZOH circuit and the FIR filter,
interface circuitry that is coupled to DSP and the input port, wherein the interface circuitry receives an output signal from the DSP; and
an output port that is coupled to the interface circuitry;
an amplifier that is coupled to the output port; and
a speaker that is coupled to the amplifier.

3. The apparatus of claim 2, wherein the interface circuitry further comprises:
a ZOH circuit that is coupled to the DSP;
a digital modulator that is coupled to the ZOH circuit; and
a digital-to-analog converter (DAC) that is coupled to the digital modulator and to the output port.

4. An apparatus comprising:
an input port that receives a digital audio input signal and that outputs a plurality of signals obtained from the digital audio input signal, wherein each signal is sampled at one of a plurality of frequencies;
a rate estimator that is coupled to the input port, wherein the rate estimator determines at least one of the frequencies;
an SRC coefficient generator that is coupled to the rate estimator, wherein the SRC coefficient generator calculates a plurality of filter coefficients, and wherein the SRC coefficient generator includes:
a multiplexer having an output terminal, a plurality of input terminals, and a selection terminal, wherein each of the input terminals of the multiplexer receives one of a step signal and an interpolation ratio;
a first adder that is coupled to the output terminal of the multiplexer;
a register that is coupled to the adder;
a comparator that is coupled to the register and the selection terminal of the multiplexer and that receives the interpolation ratio;
a divider that is coupled to the register;
a coefficient function circuit that is coupled to the divider; and
a second adder that is coupled to the coefficient function generating circuit;
a DSP that is coupled to the SRC coefficient generator and the input port, wherein the DSP performs digital-to-analog conversion filtering for the signal received from the input port and the filter coefficients from the SRC coefficient generator, and wherein the DSP includes:
a plurality of interpolation filter circuits, wherein each interpolation filter circuit receives at least one of the signals from the input port; and
a FIR filter that receives an output signal from at least one of the interpolation filter circuits and that receives the filter coefficients, wherein the FIR filter has two taps; and
interface circuitry that is coupled to the DSP and the input port, wherein the interface circuitry receives an output signal from the DSP.

5. An apparatus comprising:
a plurality of audio sources;
a codec that is coupled to the plurality of audio sources, wherein the codec includes:
an input port that receives an audio input signal from the plurality of audio sources and that outputs a plurality of signals obtained from the plurality of audio sources, that outputs a plurality of signals, wherein each signal is sampled at one of a plurality of frequencies;
a rate estimator that is coupled to the input port, wherein the rate estimator determines at least one of the frequencies;
a SRC coefficient generator that is coupled to the rate estimator, wherein the SRC coefficient generator calculates a plurality of filter coefficients, and wherein the SRC coefficient generator includes:
a multiplexer having an output terminal, a plurality of input terminals, and a selection terminal, wherein each of the input terminals of the multiplexer receives one of a step signal and an interpolation ratio;
a first adder that is coupled to the output terminal of the multiplexer;
a register that is coupled to the adder;
a comparator that is coupled to the register and the selection terminal of the multiplexer and that receives the interpolation ratio;
a divider that is coupled to the register;
a coefficient function circuit that is coupled to the divider; and
a second adder that is coupled to the coefficient function generating circuit;
a DSP that is coupled to the SRC coefficient generator and the input port, wherein the DSP performs digital-to-analog conversion filtering for the signal received from the input port and the filter coefficients from the SRC coefficient generator;
interface circuitry that is coupled to DSP and the input port, wherein the interface circuitry receives an output signal from the DSP; and
an output port that is coupled to the interface circuitry;
an amplifier that is coupled to the output port; and
a speaker that is coupled to the amplifier.

6. The apparatus of claim 5, wherein the interface circuitry further comprises:
a first ZOH circuit that is coupled to the DSP;
a second ZOH circuit that is coupled to the DSP;
a mixer that is coupled to the first and second ZOH circuits;
a digital modulator that is coupled to the mixer; and
a DAC that is coupled to the digital modulator and to the output port.

7. An apparatus comprising:
an input port that receives a digital audio input signal and that outputs a plurality of signals obtained from the digital audio input signal, wherein each signal is sampled at one of a plurality of frequencies;
a rate estimator that is coupled to the input port, wherein the rate estimator determines at least one of the frequencies;
an SRC coefficient generator that is coupled to the rate estimator, wherein the SRC coefficient generator calculates a plurality of filter coefficients, wherein the SRC coefficient generator includes:
a multiplexer having an output terminal, a plurality of input terminals, and a selection terminal, wherein each of the input terminals of the multiplexer receives one of a step signal and an interpolation ratio;
a first adder that is coupled to the output terminal of the multiplexer;

a register that is coupled to the adder;
a comparator that is coupled to the register and the selection terminal of the multiplexer and that receives the interpolation ratio;
a divider that is coupled to the register;
a coefficient function circuit that is coupled to the divider; and
a second adder that is coupled to the coefficient function generating circuit;
a DSP that is coupled to the SRC coefficient generator and the input port, wherein the DSP has a computer program product embodied thereon that includes:
computer code for upsampling each of the signals from the input port;
computer code for decoding a coefficient address;
computer code for retrieving a coefficient from a memory;
computer code for multiplexing the plurality of filter coefficients and the coefficient from the memory; and
computer code for outputting a digital signal; and
interface circuitry that is coupled to DSP, wherein the interface circuitry receives the digital signal and provides an analog signal.

8. The apparatus of claim 7, wherein the rate estimator further comprises:
a counter that receives a clock signal, wherein the clock signal is proportional to at least one of the frequencies;
a sampler that is coupled to the counter;
an edge detector that is coupled to each of the counter and the sampler;
a first adder that is coupled to the sampler;
a second adder that is coupled to the first adder;
a first register that is coupled to the second adder and the first adder;
a first attenuator that is coupled to the first register;
a second attenuator that is coupled to the first attenuator;
a third adder that is coupled to the second attenuator;
a second register that is coupled to the third adder; and
a fourth adder that is coupled to the second register and the first attenuator.

9. The apparatus of claim 7, wherein the computer program product further comprises:
computer code for applying a ZOH to at least one of the upsampled signals; and
computer code for mixing the digital signal with the upsampled signal with the applied ZOH.

10. The apparatus of claim 7, wherein the interface circuitry further comprises:
a ZOH circuit that is coupled to the DSP;
a digital modulator that is coupled to the ZOH circuit; and
a DAC that is coupled to the digital modulator and to the output port.

11. The apparatus of claim 10, wherein the apparatus further comprises an output port that is coupled to the DAC.

12. The apparatus of claim 7, wherein the interface circuitry further comprises:
a first ZOH circuit that is coupled to the DSP;
a second ZOH circuit that is coupled to the DSP;
a mixer that is coupled to the first and second ZOH circuits;
a digital modulator that is coupled to the mixer; and
a DAC that is coupled to the digital modulator and to the output port.

13. The apparatus of claim 12, wherein the apparatus further comprises an output port that is coupled to the DAC.

14. An apparatus comprising:
an input port that receives a digital audio input signal and that outputs a plurality of signals obtained from the digital audio input signal, wherein each signal is sampled at one of a plurality of frequencies;
a rate estimator that is coupled to the input port, wherein the rate estimator determines at least one of the frequencies, wherein the rate counter includes:
a counter that receives a clock signal, wherein the clock signal is proportional to at least one of the frequencies;
a sampler that is coupled to the counter;
an edge detector that is coupled to each of the counter and the sampler;
a first adder that is coupled to the sampler;
a second adder that is coupled to the first adder;
a first register that is coupled to the second adder and the first adder;
a first attenuator that is coupled to the first register;
a second attenuator that is coupled to the first attenuator;
a third adder that is coupled to the second attenuator;
a second register that is coupled to the third adder; and
a fourth adder that is coupled to the second register and the first attenuator
a SRC coefficient generator that is coupled to the rate estimator, wherein the SRC coefficient generator calculates a plurality of filter coefficients;
a DSP that is coupled to the SRC coefficient generator and the input port, wherein the DSP performs digital-to-analog conversion filtering for the signal received from the input port and the filter coefficients from the SRC coefficient generator; and
interface circuitry that is coupled to the DSP and the input port, wherein the interface circuitry receives an output signal from the DSP.

15. The apparatus of claim 14, wherein the DSP further comprises:
a plurality of interpolation filter circuits, wherein each interpolation filter circuit receives at least one of the signals from the input port; and
a FIR filter that receives an output signal from at least one of the interpolation filter circuits and that receives the filter coefficients, wherein the FIR filter has two taps.

16. An apparatus comprising:
a plurality of audio sources;
a codec that is coupled to the plurality of audio sources, wherein the codec includes:
an input port that receives an audio input signal from the plurality of audio sources and that outputs a plurality of signals obtained from the plurality of audio sources, that outputs a plurality of signals, wherein each signal is sampled at one of a plurality of frequencies;
a rate estimator that is coupled to the input port, wherein the rate estimator determines at least one of the frequencies, and wherein the rate estimator includes:
a counter that receives a clock signal, wherein the clock signal is proportional to at least one of the frequencies;
a sampler that is coupled to the counter;
an edge detector that is coupled to each of the counter and the sampler;
a first adder that is coupled to the sampler;
a second adder that is coupled to the first adder;
a first register that is coupled to the second adder and the first adder;
a first attenuator that is coupled to the first register;
a second attenuator that is coupled to the first attenuator;
a third adder that is coupled to the second attenuator;

a second register that is coupled to the third adder; and
a fourth adder that is coupled to the second register and the first attenuator;
a SRC coefficient generator that is coupled to the rate estimator, wherein the SRC coefficient generator calculates a plurality of filter coefficients;
a DSP that is coupled to the SRC coefficient generator and the input port, wherein the DSP performs digital-to-analog conversion filtering for the signal received from the input port and the filter coefficients from the SRC coefficient generator;
interface circuitry that is coupled to DSP and the input port, wherein the interface circuitry receives an output signal from the DSP; and
an output port that is coupled to the interface circuitry;
an amplifier that is coupled to the output port; and
a speaker that is coupled to the amplifier.

17. The apparatus of claim 16, wherein the DSP further comprises:
a plurality of interpolation filter circuits, wherein each interpolation filter circuit receives at least one of the signals from the input port; and
a FIR filter that receives an output signal from at least one of the interpolation filter circuits and that receives the filter coefficients, wherein the FIR filter has two taps.

* * * * *